(12) United States Patent
Chen et al.

(10) Patent No.: US 8,081,504 B2
(45) Date of Patent: Dec. 20, 2011

(54) COMPUTER MEMORY DEVICE WITH STATUS REGISTER

(75) Inventors: Yiran Chen, Eden Prairie, MN (US);
Daniel S. Reed, Maple Plain, MN (US);
Yong Lu, Rosemount, MN (US);
Hongyue Liu, Maple Grove, MN (US);
Hai Li, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 493 days.

(21) Appl. No.: 12/252,170

(22) Filed: Oct. 15, 2008

(65) Prior Publication Data

US 2010/0095050 A1 Apr. 15, 2010

(51) Int. Cl.
*G11C 11/00* (2006.01)

(52) U.S. Cl. ........ 365/158; 365/148; 711/100; 711/103; 711/E12.008

(58) Field of Classification Search ................... 365/148, 365/158; 711/100, 103, E12.008
See application file for complete search history.

(56) References Cited

U.S. PATENT DOCUMENTS

| | | | |
|---|---|---|---|
| 6,981,068 B1 | 12/2005 | Harari et al. | |
| 7,355,874 B2 | 4/2008 | Wallace et al. | |
| 2002/0093032 A1* | 7/2002 | Hanzawa et al. | 257/200 |
| 2007/0253238 A1* | 11/2007 | Resta et al. | 365/148 |
| 2007/0272036 A1* | 11/2007 | Reed | 73/862.331 |
| 2007/0294463 A1* | 12/2007 | Bono | 711/100 |

* cited by examiner

*Primary Examiner* — Fernando N. Hidalgo
(74) *Attorney, Agent, or Firm* — Fellers, Snider et al.

(57) ABSTRACT

Method and apparatus for operating a memory device with a status register. In some embodiments, the memory device has a plurality of individually programmable non-volatile memory cells comprised of at least a resistive sense memory. The memory device engages an interface and maintains a status register in some embodiments by logging at least an error or busy signal during data transfer operations.

20 Claims, 6 Drawing Sheets

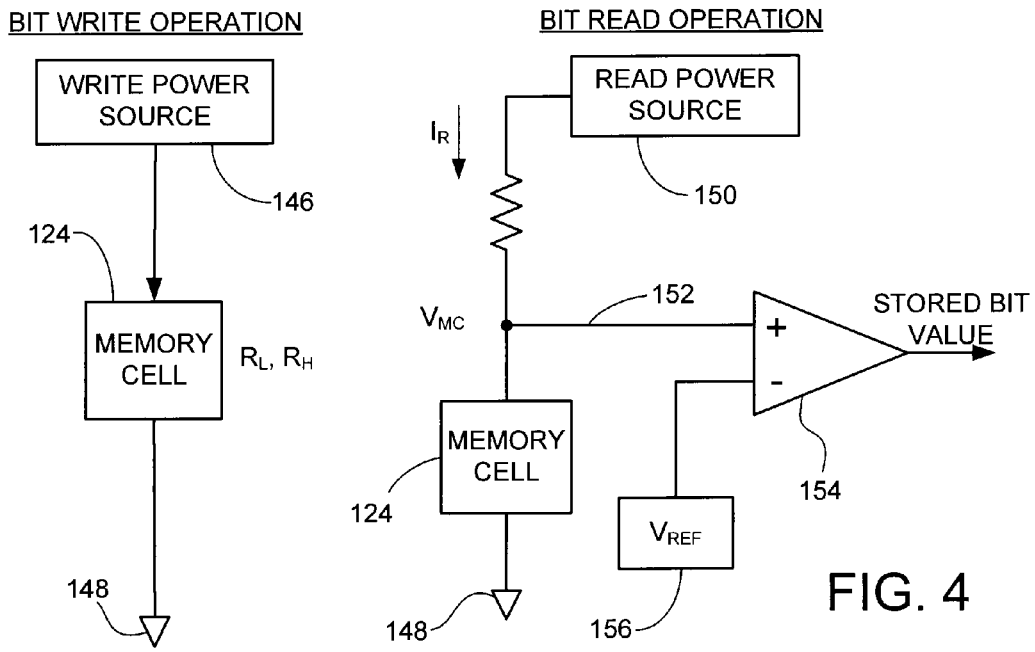
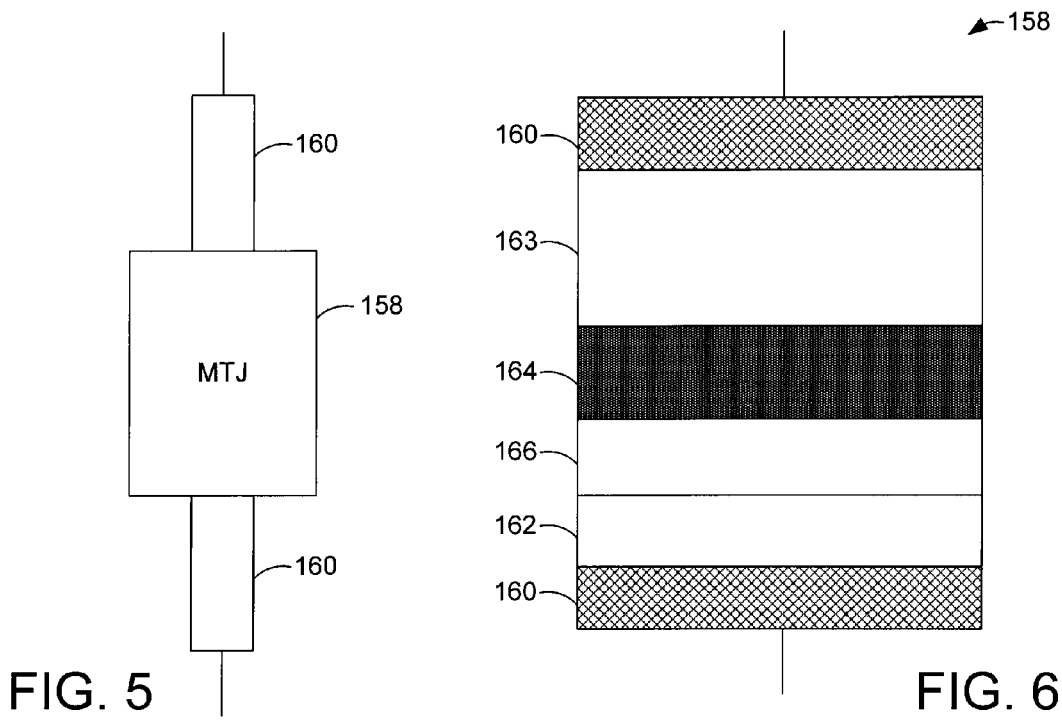

COMPUTER MEMORY DEVICE WITH STATUS REGISTER

BACKGROUND

Data storage devices generally operate to store and retrieve data in a fast and efficient manner. Some storage devices take the form of a memory card that utilizes memory cells to provide various external functions. The Personal Computer Memory Card International Association (PCMCIA) was formed to standardize computer memory cards. The PCMCIA provides physical specifications for three types of cards, specifically differing in thickness.

As will be appreciated, a computer memory card has limited physical space and power availability. The increase in computer memory card functions for personal computers in an era of mobile computing has created a need to improve the capabilities of computer memory cards while not impeding the inherent physical space and power limitations.

In these and other types of data storage devices, it is often desirable to design efficient and accurate systems, particularly with regard to the efficiency of reading data from a computer memory card.

SUMMARY

Various embodiments of the present invention are generally directed to a method and apparatus for a memory device with a status register.

In accordance with various embodiments, an interface is engaged by a memory device. The memory device has a plurality of individually programmable non-volatile memory cells comprised of at least a resistive sense memory. A status register is maintained by logging at least an error or busy signal during data transfer operations.

These and various other features and advantages which characterize the various embodiments of the present invention can be understood in view of the following detailed discussion and the accompanying drawings.

BRIEF DESCRIPTION OF THE DRAWINGS

FIG. 3 generally illustrates a manner in which data can be written to a memory cell of the memory array.

FIG. 4 generally illustrates a manner in which data can be read from the memory cell of FIG. 3.

FIG. 5 displays a memory cell structure operated in accordance with various embodiments of the present invention.

FIG. 6 generally illustrates an alternative memory cell structure operated in accordance with various embodiments of the present invention.

DETAILED DESCRIPTION

Figure 1:
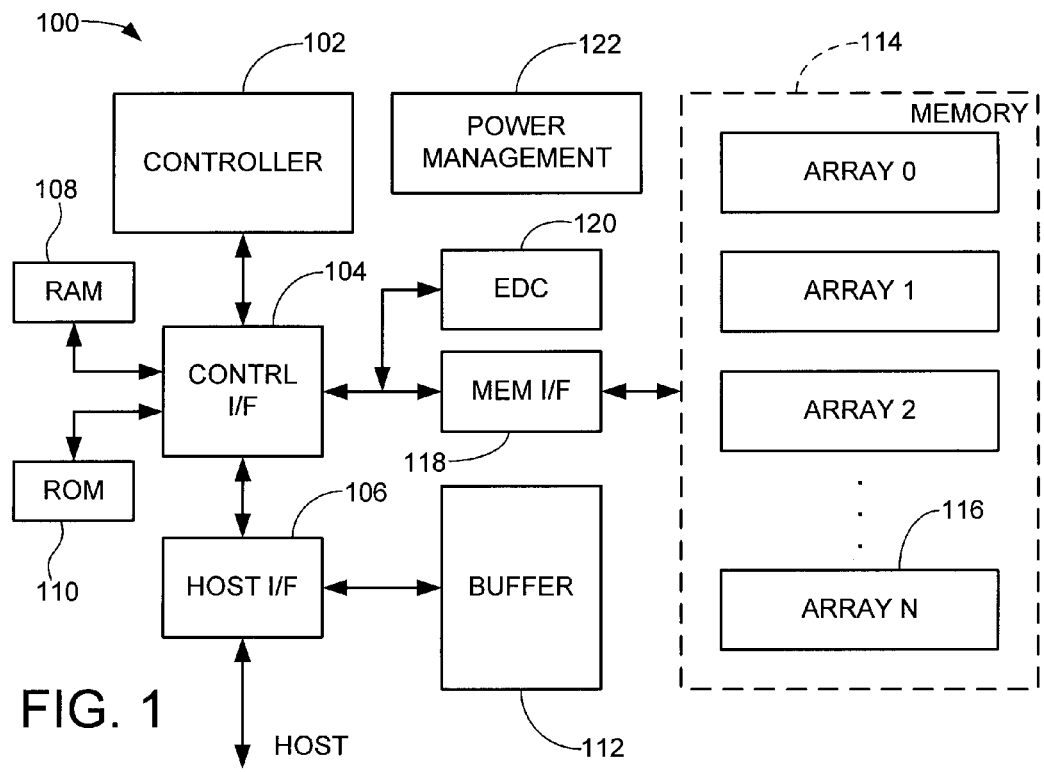
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
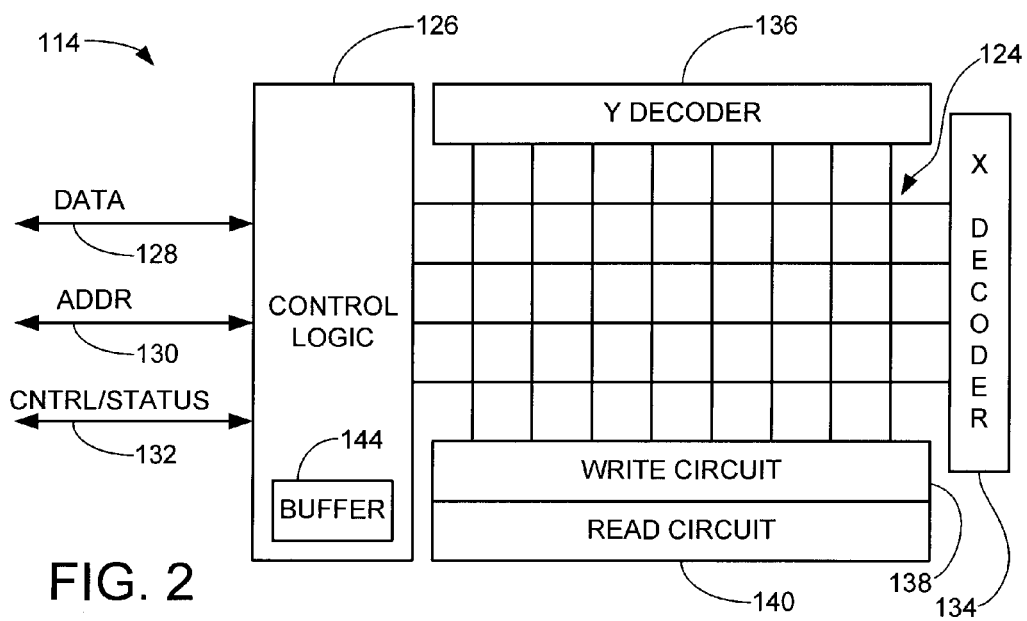
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines, etc. In some embodiments, each of the array memory cells 124 has magnetic random access memory (MRAM) configuration, such as a spin-torque transfer random access memory (STRAM) or resistive random access memory (RRAM) configuration.

The actual configurations of the cells and the access lines thereto will depend on the requirements of a given application. Generally, however, it will be appreciated that the various control lines will generally include enable lines that selectively enable and disable the respective writing and reading of the value(s) of the individual cells.

It can be appreciated by one skilled in the art that a resistive sense memory fundamentally differs from conventional flash memory. For example, a resistive sense memory is individually programmable where a flash memory requires a plurality of cells to be erased before a write operation. The individually programmable nature of resistive sense memory allows for the writing of a logic state to a single, or multiple cells, without an initial erase operation. In contrast, conventional NAND flash memory requires a time-consuming erase operation, often of a full page of memory cells, before the writing of a logic state. Thus, the ability to selectively write a logic state to a resistive sense memory without conditioning the cell with an erase operation increases the performance of the non-volatile memory while reducing power consumption of erase operations.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

Data are written to the respective memory cells 124 as generally depicted in FIG. 3. Generally, a write power source 146 applies the necessary input (such as in the form of current, voltage, magnetization, etc.) to configure the memory cell 124 to a desired state. It can be appreciated that FIG. 3 is merely a representative illustration of a bit write operation. The configuration of the write power source 146, memory cell 124, and reference node 148 can be suitably manipulated to allow writing of a selected logic state to each cell.

As explained below, in some embodiments the memory cell 124 takes a modified STRAM configuration, in which case the write power source 146 is characterized as a current driver connected through a memory cell 124 to a suitable reference node 148, such as ground. The write power source 146 provides a stream of power that is spin polarized by moving through a magnetic material in the memory cell 124. The resulting rotation of the polarized spins creates a torque that changes the magnetic moment of the memory cell 124.

Depending on the magnetic moment, the cell 124 may take either a relatively low resistance ($R_L$) or a relatively high resistance ($R_H$). While not limiting, exemplary $R_L$ values may be in the range of about 100 ohms ($\Omega$) or so, whereas exemplary $R_H$ values may be in the range of about 100 K$\Omega$ or so Other resistive memory type configurations (e.g., RRAMs) are supplied with a suitable voltage or other input to similarly provide respective $R_L$ and $R_H$ values. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The reference voltage $V_{REF}$ can be selected from various embodiments such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

FIG. 5 generally displays a memory cell structure operated in accordance with various embodiments of the present invention. A magnetic tunneling junction (MTJ) 158 is shown coupled to multiple spin polarizing magnetic materials 160. It can be appreciated that the MTJ 158 can be coupled to a single spin polarizing magnetic material 160. Likewise, the spin polarizing material 160 can be a variety of materials. For example, a first spin polarizing material 160 can be coupled to one side of an MTJ 158 while a different substance can be used for another spin polarizing material 160.

An alternate memory cell structure is shown in FIG. 6 operated in accordance with various embodiments of the present invention. A magnetic tunneling junction 158 is generally displayed with multiple spin polarizing materials 160 incorporated into the MTJ 158. In some embodiments, the spin polarizing material 160 can be coupled to a pinned layer 162 as well as a free layer 164. It should be noted that the spin polarizing material 160 can be located on a single side of the MTJ 158. Similarly, the pinned layer 162 alternatively can be a second free layer 164 capable of opposing magnetic polarity phases. The pinned layer 162 and the free layer 164 are separated by a tunneling barrier 166 that allows unique magnetic phases to exist in the pinned layer 162 in relation to the free layer 164.

Figure 7:
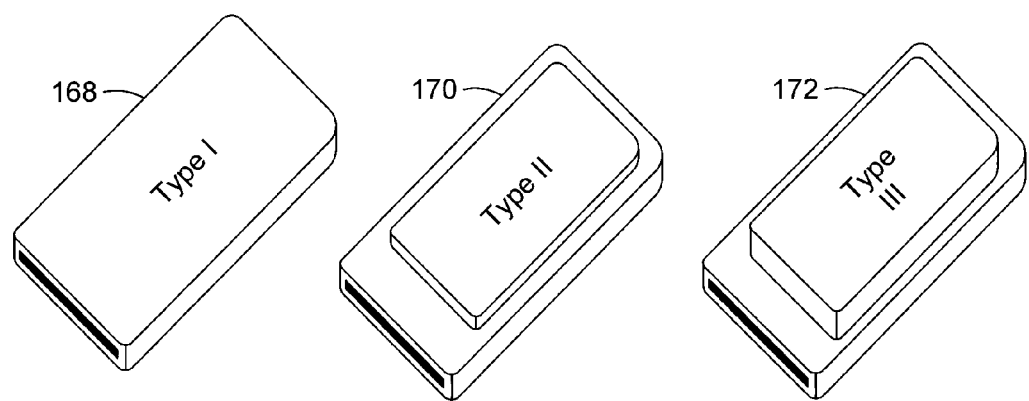
FIG. 7 shows the types of personal computer memory cards operated in accordance with various embodiments of the present invention.

FIG. 7 illustrates an exemplary personal computer memory cards (PC Card) that can be utilized with various embodiments of the present invention. A Type I PC Card 168 is conventionally used for memory devices such as random access memory (RAM), Flash, Static random access memory (SRAM), and one-time programmable (OTP) circuits. A Type II PC Card 170 is generally used for input/output (I/O) operations such as data/fax modems and mass storage devices. Finally, a Type III PC Card 172 is conventionally used for devices whose components are thicker, such as rotating mass storage devices. Typically, the only variation in the types of PC cards is the physical thickness of the card. That is, the connector, physical length, and physical width are standardized to fit universally into PC card slots.

Figure 8:
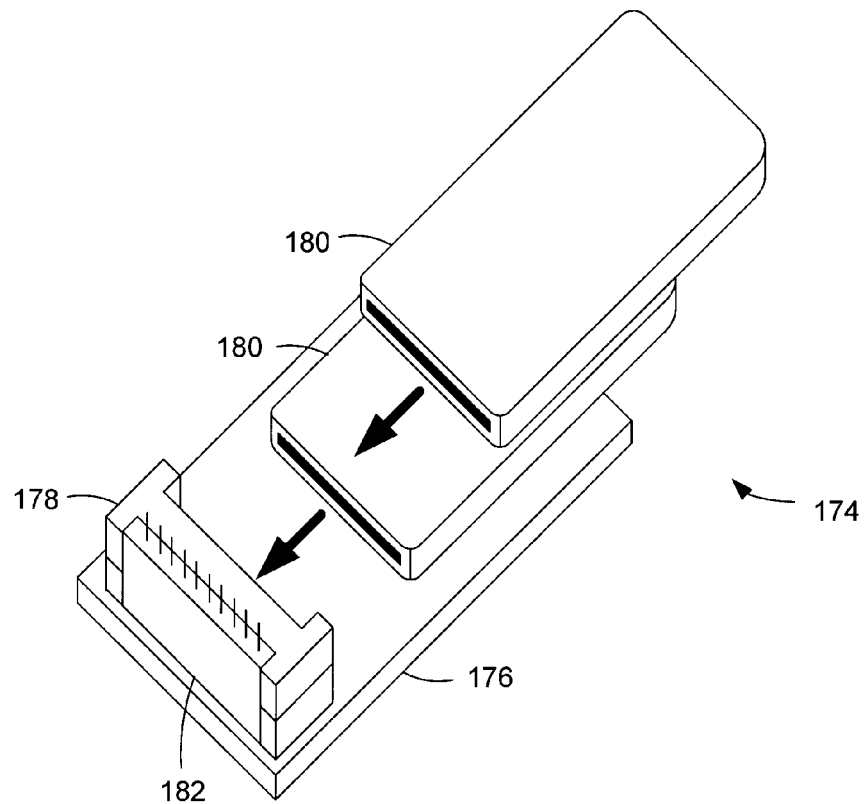
FIG. 8 displays a controller card with multiple personal computer memory cards operated in accordance with various embodiments of the present invention.

A controller card 174 having multiple sockets is generally shown in FIG. 8. In one embodiment of the present invention, the controller substrate 176 has a socket receptacle 178 that allows multiple PC Cards 180 to be connected at the same time. A connector 182 communicates with the multiple PC Cards 180 and outputs the aggregate signals to a host.

Figures 9, 10, 11:
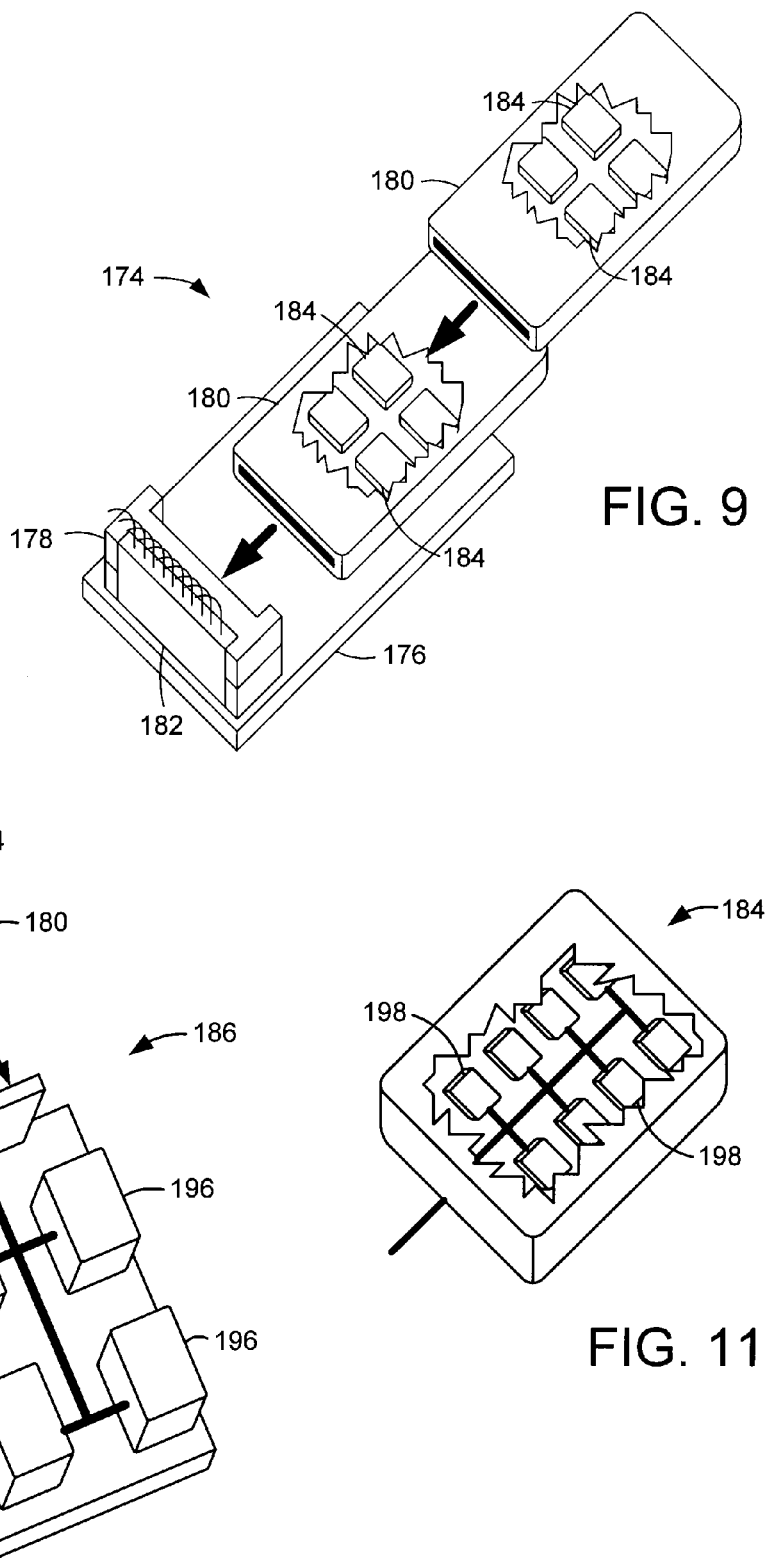
FIG. 9 generally illustrates a controller card with partial cutouts of multiple personal computer memory cards operated in accordance with various embodiments of the present invention.
FIG. 10 shows a computer system operated in accordance with various embodiments of the present invention.
FIG. 11 displays a memory module operated in accordance with various embodiments of the present invention.

FIG. 9 displays a controller card 174 with multiple sockets capable of receiving PC Cards 180. A controller substrate 176 has a socket receptacle 178 which can receive and communicate with multiple PC Cards 180, simultaneously. The socket receptacle 178 is operationally coupled to a connector 182 that allows a host computer to communicate with the multiple PC Cards 180 either individually or together. In some embodiments, the PC Cards 180 comprise multiple memory modules 184. The memory modules 184 can be operated individually or in conjunction with other modules to provide the PC Card 180 with a various amount of functional capacity.

A PC Card 180 interaction with a host computer 186 is generally illustrated in FIG. 10. An embodiment of the present invention has the PC Card 180 being comprised of at least one memory module 184 and a memory controller 188 capable of communicating with each memory module 184 and an interface 190 through a variety of signals. The variety of signals 192 can include, but are not limited to, data, logical address, control signals, read/write operations, reset, data mask, and interrupt request, etc. The interface 188 that communicates with the PC Card 180 is adjacent to a host substrate 194 that is connected to at least a control module 196. The control module 196 can be various components either individually or in combination, such as read only memory (ROM), basic input/output system (BIOS), RAM, and microprocessor. The control module 196 is configured to communicate with any other control module 196 as well as the interface 190.

FIG. 11 shows an exemplary memory module 184 in accordance with the various embodiments of the present invention. The memory module 184 contains at least one memory chips 198. In some embodiments, the memory chips 198 are a non-volatile memory such as MRAM, STRAM, and RRAM. Each memory chip 198 is interconnected with any other memory chips 198 as well as other memory modules 184.

Figure 12:
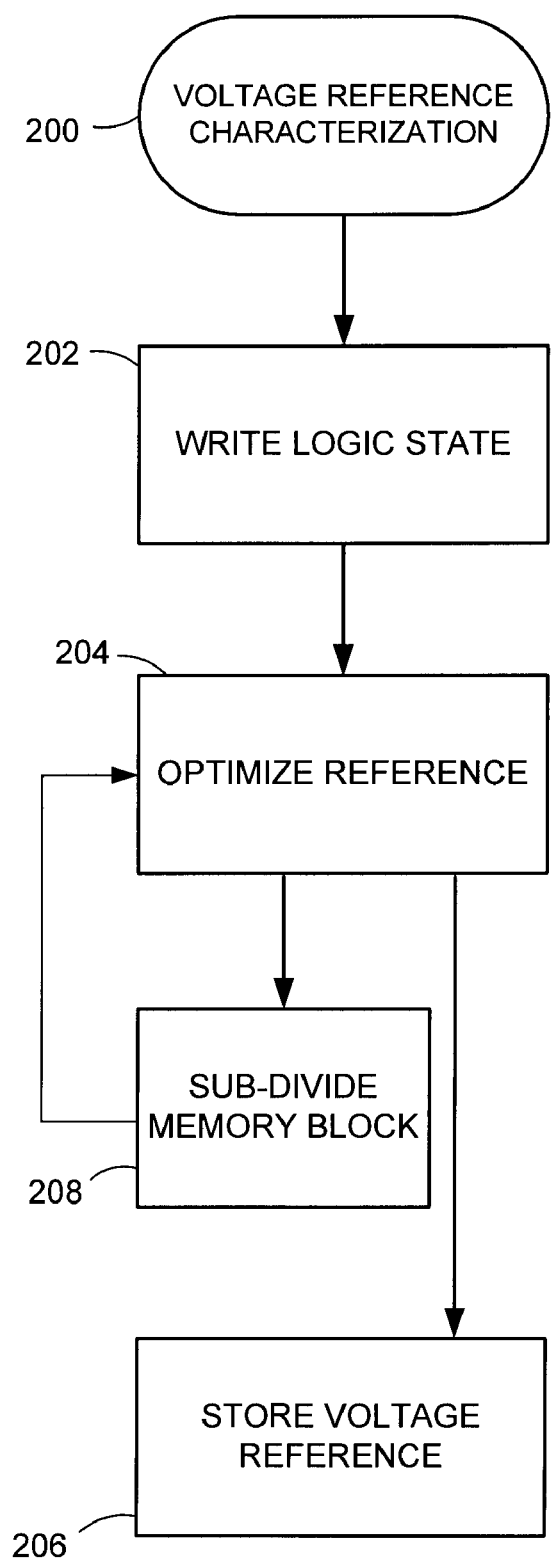
FIG. 12 shows a flow diagram for a voltage reference characterization in accordance with various embodiments of the present invention.

The flow diagram of FIG. 12 displays a voltage reference characterization 200 that functions in one embodiment on initial power up. Upon a plurality of memory cells first receiving power, an embodiment of the present invention begins to characterize the array for reference values. First, all memory cells are treated as a single block and written to an initial logical state, such as a logic state of 0 in step 202. A voltage reference is then optimized in step 204 by using producing several distributions of resistance values through the application of a series of test signals for each memory cell.

In one embodiment, a resistance value distribution is produced by repetitively reading each cell in turn using different voltage reference values that successively change in magnitude, and monitoring the output of a sense amplifier. The resistance of the cell can be correlated to the reference voltage at which the output of the sense amplifier changes state.

For example, if the cell is initially written to a logic state of 0, the resistance of the cell will be relatively low ($R_L$), and the voltage drop thereacross will also be relatively low for a given sense current. Use of an initial, relatively high voltage reference value will provide an output of 0 from the sense amplifier. Incrementally decreasing the reference voltage will eventually provide a reference value below the voltage drop across the cell, at which point the output of the sense amplifier (154 of FIG. 4) will switch to a logical 1.

This reference value can be used as an indication of the actual $R_L$ resistance of the cell; that is, the resistance $R_L$ will be substantially equal to the reference value divided by the sense current. Because of this proportionality, the resistance of the cell can be "read" merely by detecting the corresponding transition reference voltage, irrespective of whether the actual resistance of the cell is specifically calculated therefrom.

Once low resistance reference values have been obtained for all of the cells, the cells are written to a logic state of 1 and the foregoing process is repeated (the initial reference values and direction of sweeping may be the same, or may be different as desired). It will be appreciated that the foregoing example is merely illustrative and any number of sensing techniques can be used to determine the respective distributions through the optimization process of step 204.

The optimization of the voltage reference in step 204 then proceeds to compare a low resistance maximum value obtained from the low resistance distribution to a high resistance minimum value obtained from the high resistance distribution. A differentiation between resistance distributions is indicated by having the high resistance minimum being greater than the low resistance maximum. An embodiment of the present invention stores the voltage reference for the block of memory in a table at step 206 if the high resistance minimum is greater than the low resistance maximum. However if the high resistance minimum is less than the low resistance maximum, there will be an overlap in the distributions, so the use of a single global reference value may not correctly identify the logic state of all cells. In such case, the memory block will be sub-divided in step 208.

The sub-divide operation of step 208 creates extra table entries to accommodate the sub-division of blocks in step 208. The sub-division of blocks divides the previous memory block into predetermined smaller block sizes. Once the memory blocks are divided, the optimization of the extra memory cells is entered and operated.

It should be noted that the sub-division of memory block in step 208 likely occurs in a high percentage of voltage reference characterization 200 due to the fact that a single voltage reference for a plurality of memory cells will often not provide accurate logical state reading. Therefore, the sub-division of memory cells 208 will cycle and continue to sub-divide the memory blocks until optimal differentiation of resistance distributions are obtained. Thus, it is recognized that the voltage reference characterization 200 can produce a single voltage reference or a voltage reference for every bit in a memory array as necessary.

Figure 13:
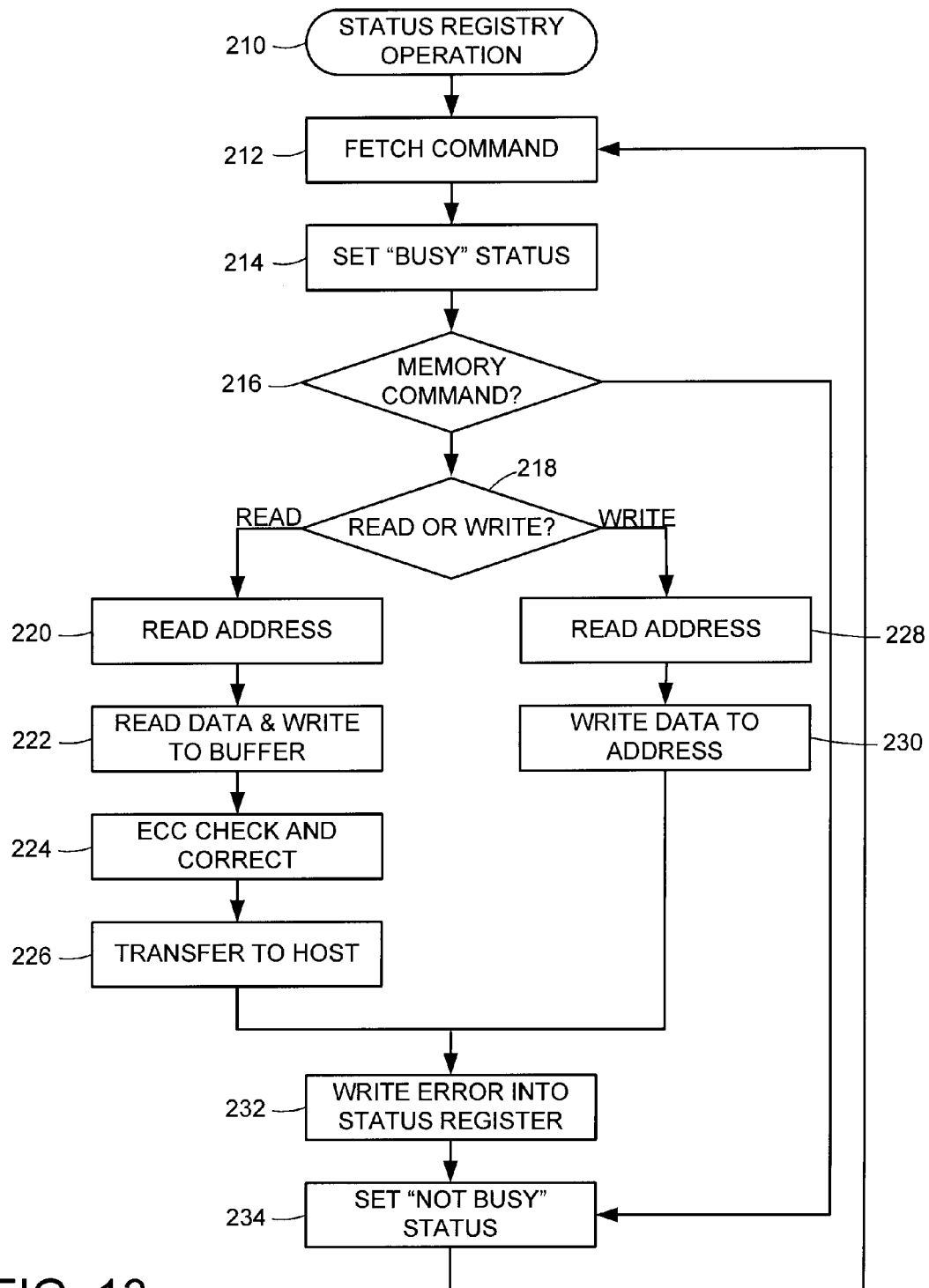
FIG. 13 shows a flow diagram for a status registry operation in accordance with various embodiments of the present invention.

FIG. 13 shows a flow chart of a status registry operation 210 performed in accordance with the various embodiments of the present invention. In some embodiments, the status registry operation 210 is carried out by the host computer microprocessor (196 of FIG. 10) in communication with the memory modules (184 of FIGS. 9, 10, and 11) of each PC Card 180 of FIGS. 8, 9, and 10. The status registry operation 210 first fetches a command from a command register in step 212 and sets the status registry to "busy" in step 214. A check is conducted at step 216 to ensure a memory command is being requested. A bifurcation of the status registry operation 210 occurs at step 218 when the command is classified as a read or a write. For a memory read, the memory address is read at step 220, the data located at the address is read and written to a buffer at step 222, an error correction code (ECC) check and correction is optionally performed at step 224, and the data is transferred to the command host at step 226. In contrast, a write command will have the memory address read at step 228 and the command data written to the address in step 230.

At the conclusion of either the write or read command, any errors are written to the status register in step 232. At step 234, a "not busy" status is written to the status register once the command and error functions are completed. A "not busy" status is also written to the status register if a command received is not a memory command from step 216. Finally, the status registry operation 210 is cycled at the completion of step 234 with the fetching of a new command.

Other advantages of the various embodiments presented herein will readily occur to the skilled artisan in view of the present disclosure. For example a variety of configurations of memory can be constructed and controlled to efficiently and accurately manage data. Moreover, computer memory devices can optimize performance by using voltage reference values. The voltage reference values can be assigned to groups of cells in any convenient manner, whether at the array level, individual block level, at the sector level, at the word line level, etc. It will further be appreciated that groups of cells for a given reference value can be physically discontinuous and hence non-adjacent to one another. These and other considerations can be readily implemented depending on the requirements of a given application.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
engaging an interface with a memory device comprised of a plurality of individually programmable non-volatile resistive sense memory cells;
maintaining a status register by a microprocessor, the status register logging at least an error signal corresponding to an erroneous voltage reference during data transfer operations to a memory cell of the plurality of memory cells; and
correcting the erroneous voltage reference by deriving a corrected voltage reference for the memory cell from a plurality of resistance values for the memory cell; and
wherein, if a high resistance minimum value of the memory cell is less than a low resistance maximum value of the memory cell, then the memory device is sub-divided.

2. The method of claim 1, wherein the resistive sense memory comprises a resistive random access memory (RRAM).

3. The method of claim 1, wherein the resistive sense memory comprises a magnetic tunneling junction (MTJ).

4. The method of claim 1, wherein an initial voltage reference is characterized for each of the plurality of memory cells.

5. The method of claim 1, wherein the corrected voltage reference is derived after the error signal is logged in the status register.

6. The method of claim 4, wherein the initial voltage reference for each cell is stored in a table.

7. The method of claim 4, wherein the characterization of the initial voltage references is performed at the original initialization of the memory cells.

8. The method of claim 7, wherein an existing voltage reference is used after the previously activated memory cells are deactivated and subsequently activated.

9. The method of claim 1, wherein the memory device is configured as a personal computer card.

10. The method of claim 1, wherein the interface transfers data through a serial link between a host computer and a memory controller.

11. The method of claim 10, wherein the memory controller is connected to a plurality of memory modules comprised of memory circuit chips connected by a common substrate.

12. An apparatus comprising a personal computer card configured to engage an interface and comprised of a memory device which is comprised of a plurality of individually programmable non-volatile memory cells, wherein the memory cells are comprised of a resistive sense memory, and a control circuitry configured to maintain a status register by logging at least an error signal corresponding to an erroneous voltage reference during data transfer operations to a memory cell and correct the error voltage reference by deriving a corrected voltage reference for the memory cell from a plurality of resistance values for the memory cell; and
wherein, if a high resistance minimum value of the memory cell is less than a low resistance maximum of the memory cell, then the memory device is sub-divided.

13. The apparatus of claim 12, wherein the resistive sense memory comprises a resistive random access memory (RRAM).

14. The apparatus of claim 12, wherein the resistive sense memory comprises a magnetic tunneling junction (MTJ).

15. The apparatus of claim 12, wherein the control circuitry comprises a microprocessor.

16. The apparatus of claim 12, wherein the control circuitry characterizes a voltage reference for each memory cell in the plurality of memory cells and derives a voltage reference from a plurality of resistance values for each memory cell and stores the reference in a table.

17. The apparatus of claim 12, wherein the interface transfers data through a serial link between a host computer and a memory controller.

18. The apparatus of claim 17, wherein the memory controller is connected to a plurality of memory modules comprised of memory circuit chips connected by a common substrate.

19. A method comprising providing a memory device comprising a plurality of memory cells comprising individually programmable non-volatile spin-torque random access memory and maintaining a status register by a microprocessor, the status register prompting a voltage reference correction in response to a detected voltage reference error during a data transfer operation to a memory cell, the voltage reference correction replacing an initial voltage reference of the memory cell with a corrected voltage reference derived from a plurality of resistance values for the memory cell; and
wherein, if a high resistance minimum value of the memory cell is less than a low resistance maximum value of the memory cell, then the memory device is sub-divided.

20. The method of claim 19, wherein a different initial voltage reference is assigned to each memory cell of the plurality of memory cells upon an original initialization of the memory cells.

* * * * *